United States Patent
Nakamura et al.

(10) Patent No.: US 9,564,552 B2
(45) Date of Patent: Feb. 7, 2017

(54) METHOD FOR PRODUCING GROUP III NITRIDE SEMICONDUCTOR LIGHT-EMITTING DEVICE

(71) Applicant: TOYODA GOSEI CO., LTD., Kiyosu-shi (JP)

(72) Inventors: Ryo Nakamura, Kiyosu (JP); Kengo Nagata, Kiyosu (JP)

(73) Assignee: TOYODA GOSEI CO., LTD., Kiyosu-Shi, Aichi-Ken (JP)

(*) Notice: Subject to any disclaimer, the term of this patent is extended or adjusted under 35 U.S.C. 154(b) by 0 days.

(21) Appl. No.: 14/606,696

(22) Filed: Jan. 27, 2015

(65) Prior Publication Data

US 2016/0293792 A1    Oct. 6, 2016

(30) Foreign Application Priority Data

Feb. 19, 2014    (JP) .................... 2014-029972

(51) Int. Cl.

| | | |
|---|---|---|
| H01L 21/00 | (2006.01) | |
| H01L 33/00 | (2010.01) | |
| H01L 33/06 | (2010.01) | |
| H01L 33/32 | (2010.01) | |
| H01L 33/12 | (2010.01) | |
| H01L 33/22 | (2010.01) | |
| H01L 33/42 | (2010.01) | |

(52) U.S. Cl.
CPC ....... *H01L 33/0075* (2013.01); *H01L 33/0066* (2013.01); *H01L 33/06* (2013.01); *H01L 33/12* (2013.01); *H01L 33/22* (2013.01); *H01L 33/32* (2013.01); *H01L 33/42* (2013.01)

(58) Field of Classification Search
None
See application file for complete search history.

(56) References Cited

U.S. PATENT DOCUMENTS

2011/0168974 A1* 7/2011 Okuno .................... H01L 33/32
                                                         257/13

FOREIGN PATENT DOCUMENTS

| JP | 2001-332763 A | 11/2001 |
|---|---|---|
| JP | 2010-080619 A | 4/2010 |
| JP | 2012-216751 A | 11/2012 |

* cited by examiner

*Primary Examiner* — Jack Chen
(74) *Attorney, Agent, or Firm* — McGinn IP Law Group, PLLC

(57) ABSTRACT

The present invention provides a Group III nitride semiconductor light-emitting device exhibiting improved emission performance. In a MQW structure light-emitting layer in which a plurality of layer units is repeatedly deposited, each layer unit comprising an InGaN well layer, a GaN protective layer, and an AlGaN barrier layer sequentially deposited, the protective layer is formed as follows. The protective layer is grown at the same temperature as employed for the well layer. The growth rate of the protective layer is larger than 0.5 times and not larger than 1.1 times the growth rate of the well layer. The protective layer is formed so as to have a thickness of 5 Å to 8 Å at the start of growth of the barrier layer being formed thereafter.

10 Claims, 3 Drawing Sheets

METHOD FOR PRODUCING GROUP III NITRIDE SEMICONDUCTOR LIGHT-EMITTING DEVICE

BACKGROUND OF THE INVENTION

Field of the Invention

The present invention relates to a method for producing a Group III nitride semiconductor light-emitting device characterized by the structure of light-emitting layer. More specifically, the light-emitting layer has a MQW structure in which a plurality of layer units are repeatedly deposited, each layer unit comprising a well layer, a protective layer, and a barrier layer sequentially deposited, and is characterized by the method for forming a protective layer.

Background Art

A MQW structure comprising an InGaN well layer and an AlGaN barrier layer alternately and repeatedly deposited, is widely used as a light-emitting layer of Group III nitride semiconductor light-emitting device. Since the barrier layer is formed of AlGaN, the growth temperature of the barrier layer must be higher than that of the well layer to grow with good crystallinity. Therefore, after the formation of the well layer, it is necessary to raise the temperature, and then grow the barrier layer. However, In is evaporated from the well layer due to heating, thereby causing reduction in emission performance or variation in emission wavelength. Therefore, a protective layer is provided between the well layer and the barrier layer, which is grown at the same temperature as the growth temperature of the well layer, thereby preventing the evaporation of In.

Japanese Patent Application Laid-Open (kokai) No. 2010-80619 discloses that a protective layer formed of AlGaN having a thickness of 6 Å is used. Japanese Patent Application Laid-Open (kokai) No. 2012-216751 discloses that a protective layer formed of GaN having a thickness of 6 Å is used.

Moreover, Japanese Patent Application Laid-Open (kokai) No. 2001-332763 discloses that a protective layer is formed of InGaN, and the growth rate of the protective layer is 1.5 times to 5 times higher than that of the well layer. During heating for formation of the barrier layer after the formation of the protective layer, the protective layer is thermally decomposed so that the protective layer is almost evaporated at the start of growth of the barrier layer.

The thickness of the protective layer is an important issue. When the protective layer is too thin, the evaporation of In from the well layer is not prevented. When the protective layer is too thick, carriers are trapped or recombined in the protective layer, thereby reducing emission performance.

Therefore, when forming the protective layer, controllability of the thickness must be improved. Conventionally, the thickness was controlled by making the growth rate of the protective layer extremely lower than that of the well layer. However, this method cannot improve emission performance as expected, rather emission performance was reduced.

The inventors have found, as a result of intensive research to determine the cause, that the crystallinity of an interface between the well layer and the protective layer is deteriorated due to fluctuation of raw material gas flow caused by making the growth rate different between the well layer and the protective layer.

SUMMARY OF THE INVENTION

The present invention has been accomplished for solving the aforementioned problem. Accordingly, an object of the present invention is to provide a method for producing Group III nitride semiconductor light-emitting device exhibiting improved emission performance.

In the method for producing a Group III nitride semiconductor light-emitting device having an MQW-structure light-emitting layer in which a plurality of layer units are repeatedly deposited, each layer unit comprising a well layer formed of Group III nitride semiconductor containing In, a GaN protective layer, and a barrier layer formed of Group III nitride semiconductor containing Al sequentially deposited, the protective layer is grown at the same temperature as the growth temperature of the well layer and at a growth rate of larger than 0.5 times and not larger than 1.1 times that of the well layer through MOCVD on the well layer so as to have a thickness of 5 Å to 8 Å (not less than 5 Å and not larger than 8 Å) at the start of growth of the barrier layer being formed thereafter.

The protective layer is preferably formed so as to have a thickness of two or three monolayers at the start of growth of the barrier layer being formed thereafter. That is, the protective layer is preferably formed so as to have a thickness of two or three monolayers even if a part of the protective layer is evaporated during heating up to start forming the barrier layer. When the protective layer has a thickness of two or three monolayers, emission performance can be further improved. The thickness of one monolayer of GaN corresponds to ½ of the c-axis lattice constant of GaN, and the thickness of two monolayers is 5.185 Å.

The protective layer is more preferably grown at a growth rate of 0.7 times to 1.0 times (not less than 0.7 times and not larger than 1.0 times) the growth rate of the well layer. Thereby, emission performance can be more improved. Since the growth rates of the well layer and the protective layer almost depend on the flow rate of Ga raw material gas, the growth rate of the protective layer can be within the above range of 0.7 times to 1.0 times the growth rate of the well layer by setting the flow rate of the Ga raw material gas 0.7 times to 1.0 times the flow rate when the well layer is formed.

More preferably, the protective layer is grown at the same growth rate as that of the well layer by maintaining the flow rate of the Ga raw material gas to be the same as when the well layer is formed. Fluctuation of raw material gas is minimized when switching from the formation of the well layer to the formation of the protective layer, and crystallinity at the interface between the well layer and the protective layer is most improved, thereby improving emission performance.

The barrier layer is preferably formed at a higher growth temperature than those employed for the well layer and the protective layer because the crystallinity of the barrier layer is improved, thereby improving emission performance.

In the method for producing the Group III nitride semiconductor light-emitting device of the present invention, the protective layer is formed so as to have an appropriate thickness of 5 Å to 8 Å, thereby improving carrier confinement. Since the growth rate of the protective layer is larger than 0.5 times and not larger than 1.1 times the growth rate of the well layer, degradation in crystal quality is suppressed at the interface between the well layer and the protective layer. Therefore, emission performance can be improved in the Group III nitride semiconductor light-emitting device.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENT

A specific embodiment of the present invention will next be described with reference to the drawings. However, the present invention is not limited to the embodiment.

Embodiment 1

Device Structure

Figure 1:
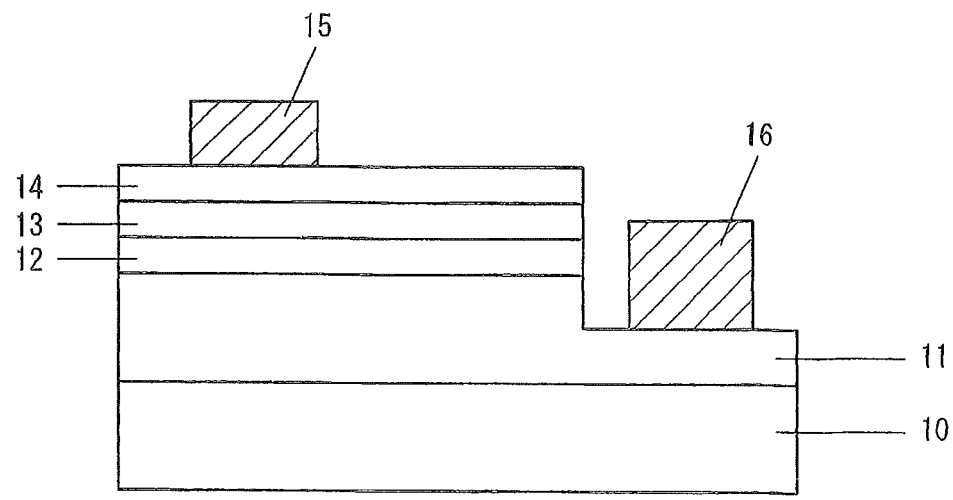
FIG. 1 shows the structure of Group III nitride semiconductor light-emitting device according to Embodiment 1.

FIG. 1 shows the structure of Group III nitride semiconductor light-emitting device according to Embodiment 1. As shown in FIG. 1, the Group III nitride semiconductor light-emitting device according to Embodiment 1 is a face-up type light-emitting device comprising a sapphire substrate 10, an n-type layer 11 disposed on the sapphire substrate 10, a light-emitting layer 12 disposed on the n-type layer 11, a p-type layer 13 disposed on the light-emitting layer 12, a transparent electrode 14 disposed on a part of the p-type layer 13, a p-electrode 15, and an n-electrode 16.

The sapphire substrate 10 is a growth substrate for crystal growing Group III nitride semiconductor on a main surface thereof. The main surface is, for example, an a-plane or c-plane. On the surface of the sapphire substrate 10, unevenness of concave and convex may be formed in a dot pattern or a stripe pattern to improve light extraction performance. The sapphire substrate 10 may be replaced with a substrate formed of, for example, GaN, SiC, ZnO, or Si.

The n-type layer 11 is disposed via an AlN buffer layer (not illustrated) on the uneven surface of the sapphire substrate 10. Moreover, the n-type layer 11 has a layered structure in which an n-type contact layer, an ESD layer, and an n-type cladding layer are deposited in this order on the sapphire substrate 10. The n-type contact layer is formed of, for example, n-GaN having a Si concentration of $1 \times 10^{18}/cm^3$ or more. The n-type contact layer may comprise a plurality of layers having different Si concentrations. The ESD layer has a layered structure including an non-doped GaN layer and an n-GaN layer, and serves as a layer for improving electrostatic breakdown voltage. The n-type cladding layer has a superlattice structure in which an InGaN layer and an n-GaN layer are alternately and repeatedly deposited.

Figure 2:
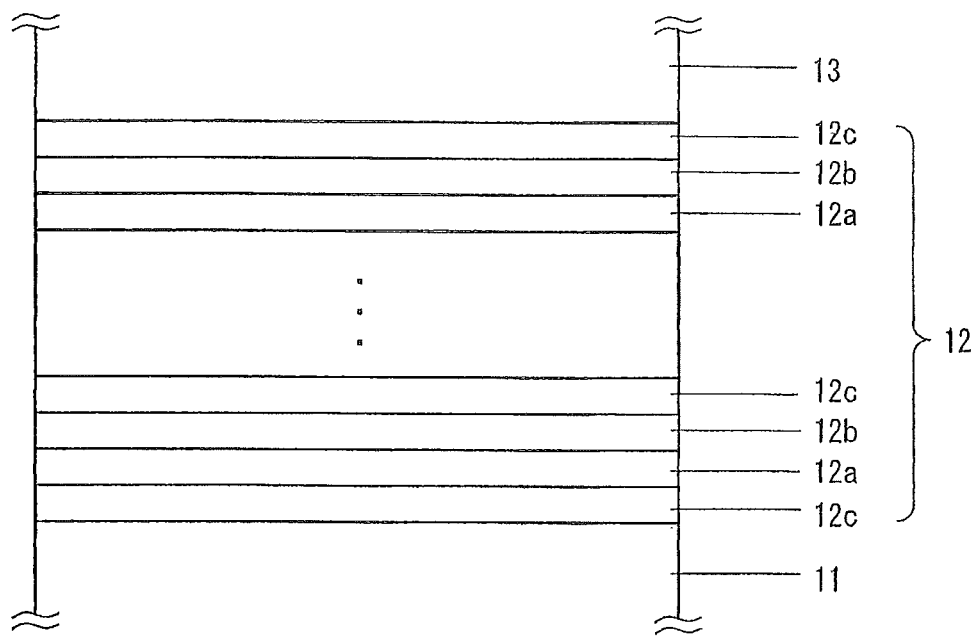
FIG. 2 shows the structure of light-emitting layer 12.

The light-emitting layer 12, as shown in FIG. 2, has a MQW structure in which a plurality of layer units are repeatedly deposited, each layer unit comprising a well layer 12a, a protective layer 12b, and a barrier layer 12c deposited in this order. The number of repetitions is three to ten times. The n-type layer 11 and the p-type layer 13 are both in contact with the respective nearest layers of the barrier layers 12c. The overall thickness of the light-emitting layer 12 is 500 nm to 700 nm.

The p-type layer 13 has a layered structure in which a p-type cladding layer and a p-type contact layer are sequentially deposited on the light-emitting layer 12. The p-type cladding layer may have a superlattice structure in which a p-InGaN layer and a p-AlGaN layer are alternately and repeatedly deposited on the light-emitting layer 12. The p-InGaN layer has an In composition ratio of 5% to 12%, and a thickness of 2 nm. The p-AlGaN layer has an Al composition ratio of 25% to 40%, and a thickness of 2.5 nm. The p-type contact layer on the p-type cladding layer is formed of p-GaN having a Mg concentration of $1 \times 10^{19}/cm^3$ or more, and a thickness of 80 nm. The p-type contact layer may comprise a plurality of layers having different Mg concentrations.

The transparent electrode 14 is formed of ITO so as to cover almost the entire surface of the p-type layer 13. The transparent electrode 14 may be formed of, for example, IZO (Indium Zinc Oxide) and ICO (Indium Cerium-Oxide) other than ITO.

The p-electrode 15 is disposed on the transparent electrode 14. The n-electrode 16 is disposed on the n-type contact layer of the n-type layer 11 exposed in the bottom surface of the trench. The trench is provided in a part of the semiconductor layer (n-type layer 11, light-emitting layer 12, and p-type layer 13), and has a depth extending from the surface of the p-type layer 13 to the n-type contact layer of the n-type layer 11. The p-electrode 15 and the n-electrode 16 have a pad portion to which a wire is connected, and a wiring portion continuous with the pad portion, which extends in a linear pattern.

The structure of the light-emitting layer 12 will next be described in detail with reference to FIG. 2.

The well layer 12a is formed of InGaN having an In composition ratio within a range of, for example, 5% to 30% so that the emission wavelength is 380 nm to 460 nm. The well layer 12a has a thickness within a range of 1 nm to 5 nm.

The protective layer 12b comprises a single GaN layer. The protective layer 12b has a thickness of 5 Å to 8 Å. Here, the thickness of the protective layer 12b means not the thickness when the protective layer 12b is formed, but the thickness of the protective layer 12b remained without being thermally decomposed during heating after the formation of the protective layer 12b. Hereinafter, the thickness of the protective layer 12b has the same meaning unless otherwise stated. By setting the thickness of the protective layer 12b within a range of 5 Å to 8 Å, carriers can be suppressed from being trapped or recombined in the protective layer 12b, thereby improving emission performance. More preferably, the protective layer 12b has a thickness of two or three monolayers. The thickness of one monolayer of GaN corresponds to ½ of the c-axis lattice constant of GaN, and the thickness of two monolayers is 5.185 Å.

The barrier layer 12c is formed of AlGaN having an Al composition ratio of 3% to 10%, and a thickness of 1 nm to 10 nm. The barrier layer 12c has a bandgap not less than that of the protective layer 12b. The barrier layer 12c is not limited to a single AlGaN layer, and may comprise a plurality of layers, for example, layers having different Al composition ratios.

[Production Process]

Next will be described processes for producing the Group III nitride semiconductor light-emitting device according to Embodiment 1. MOCVD is employed for crystal growth of Group III nitride semiconductor. The raw material gases employed in MOCVD are as follows: ammonia ($NH_3$) as a nitrogen source; trimethylgallium ($Ga(CH_3)_3$) as a Ga source; trimethylindium ($In(CH_3)_3$) as an In source; trimethylaluminum ($Al(CH_3)_3$) as an Al source; silane ($SiH_4$) as an n-type doping gas; bis(cyclopentadienyl)magnesium (Mg $(C_5H_5)_2$) as a p-type doping gas; and $H_2$ and $N_2$ as carrier gases. Needless to say, organic metal gases may be employed other than the raw material gases employed in MOCVD.

Firstly, a sapphire substrate 10 is prepared, and the sapphire substrate 10 is heated in a hydrogen atmosphere for surface cleaning. Subsequently, an AlN buffer layer (not illustrated) is formed on the sapphire substrate 10 through MOCVD, and an n-type layer 11 is formed by sequentially depositing an n-type contact layer, an ESD layer, and an n-type cladding layer on the buffer layer.

Next, on the n-type layer 11, a well layer 12a, a protective layer 12b, and a barrier layer 12c are repeatedly deposited in this order, to thereby form a light-emitting layer 12 having a MQW structure.

Here, a process for forming the light-emitting layer 12 is described in more detail.

Firstly, on the n-type layer 11, an AlGaN barrier layer 12c is formed at a temperature of 765° C. to 985° C. Subsequently, the temperature is lowered to a temperature below the growth temperature of the barrier layer 12c within a range of 700° C. to 850° C., and an InGaN well layer 12a is formed. Then, on the well layer 12a, a GaN protective layer 12b is formed at the same temperature as employed for the well layer 12a. Thus, the protective layer 12b can be formed while suppressing the evaporation of In from the well layer 12a.

In forming the protective layer 12b, the flow rate of trimethylgallium (TMG) is larger than 0.5 times and not larger than 1.1 times the flow rate of TMG (hereinafter referred to as TMG flow rate) when the well layer 12a is formed, and the flow rates of other raw material gases or carrier gases are unchanged. Since the growth rate of the Group III nitride semiconductor is almost in proportion to the TMG flow rate, the growth rate of the protective layer 12b is larger than 0.5 times and not larger than 1.1 times the growth rate of the well layer 12a. By maintaining the growth rate of the protective layer 12b within a range of larger than 0.5 times and not larger than 1.1 times the growth rate of the well layer 12a, the instability of crystal growth due to fluctuation of raw material gas flow is removed, and the deterioration of crystal quality is suppressed at an interface between the well layer 12a and the protective layer 12b. As a result, emission performance can be improved.

More preferably, the growth rate of the protective layer 12b is 0.7 times to 1.0 times the growth rate of the well layer 12b. Further preferably, the growth rate of the protective layer 12b is the same as the growth rate of the well layer 12a. To achieve this, it is enough to maintain the TMG flow rate as it is when the well layer 12a is formed. When the growth rate of the protective layer 12b is the same as the growth rate of the well layer 12a, the fluctuation of raw material gas is minimized in an early stage of crystal growth of the protective layer 12b, and the deterioration of crystal quality can be most effectively suppressed at the interface between the well layer 12a and the protective layer 12b.

The protective layer 12b is formed so as to have a thickness of 5 Å to 8 Å at the start of growth of the barrier layer 12c being formed thereafter. In the next process, the temperature is raised to make the growth temperature of the barrier layer 12c higher than that of the protective layer 12b.

Since the protective layer 12b is thermally decomposed and thinned in heating, the protective layer 12b must be formed so as to have a larger thickness than a desired thickness. The specific required thickness depends on the thermal decomposition temperature and the growth temperature of the protective layer 12b. For example, when the growth temperature is 900° C. to 950° C., the protective layer 12b is thinned at the thermal decomposition rate of 0.02 Å/sec to 0.03 Å/sec. Therefore, if the protective layer 12b is grown so as to have a larger thickness by a thickness to be evaporated due to the decomposition, the protective layer 12b still have a thickness of 5 Å to 8 Å at the start of growth of the barrier layer 12c even if a part of the protective layer 12b is thermally decomposed during heating up for the next process. The thickness of the protective layer 12b remained at the start of growth of the barrier layer 12c is also the thickness of the protective layer 12b after the production of the Group III nitride semiconductor light-emitting device according to Embodiment 1.

When the protective layer 12b has a thickness of 5 Å or more, it can sufficiently function as the protective layer 12b. When the protective layer 12b has a thickness of 8 Å or less, carriers can be suppressed from being trapped or recombined in the protective layer 12b. Therefore, when the protective layer 12b has a thickness of 5 Å to 8 Å, emission performance can be improved.

More preferably, the protective layer 12b is formed so as to have a thickness of two or three monolayers at the start of growth of the barrier layer 12c being formed after the formation of the protective layer 12b. The thickness of one monolayer of GaN corresponds to ½ of the c-axis lattice constant of GaN, and the thickness of two monolayers is 5.185 Å. Two monolayers is the minimum thickness to maintain the function of the protective layer 12b that prevents the evaporation of In from the well layer 12a during heating for forming the barrier layer 12c. Therefore, carriers can be sufficiently suppressed from being captured or recombined in the protective layer 12b. Thus, when the protective layer 12b has a thickness of two or three monolayers, emission performance can be improved most.

Next, the supply of the raw material gases is stopped, and the temperature is raised up to a range of 850° C. to 950° C. During heating, the protective layer 12b is thermally decomposed and gradually thinned. Since the protective layer 12b is deposited within a thickness range of 5 Å to 8 Å plus a thickness to be evaporated, the protective layer 12b can still have a thickness of 5 Å to 8 Å at the start of growth of the barrier layer 12c. The presence of the protective layer 12b prevents the evaporation of In from the well layer 12a, and suppresses the damage of the well layer 12a, thereby improving emission performance.

The raw material gases are supplied again, a barrier layer 12c is formed at a temperature of 850° C. to 950° C. on the protective layer 12b. Similarly, a well layer 12a, a protective layer 12b, and a barrier layer 12c are deposited sequentially and repeatedly by a predetermined number of times. Preferably, the growth temperatures of the well layer 12a and the protective layer 12b differ by 50° C. to 200° C. from the growth temperature of the barrier layer 12c. When the growth temperature difference is less than 50° C., the crystallinity of the barrier layer 12c is not sufficiently improved, and when the growth temperature difference exceeds 200° C., the crystallinity of the well layer 12a is impaired.

In this way, as shown in FIG. 2, a light-emitting layer 12 having a MQW structure was formed, in which a plurality of layer units are repeatedly deposited, each layer unit comprising a well layer 12a, a protective layer 12b, and a barrier layer 12c deposited in this order.

Subsequently, a p-type cladding layer and a p-type contact layer are sequentially deposited on the light-emitting layer 12, to thereby form a p-type layer 13. A transparent electrode 14 is formed by sputtering or vapor deposition on a part of the p-type layer 13 (part where no trench is formed in the next process).

Then, the surface of the p-type layer 13 on which the transparent electrode 14 is not formed, is subjected to dry etching, to thereby form a trench having a depth extending from the top surface of the p-type layer 13 to the n-type contact layer of the n-type layer 11. The transparent electrode 14 may be formed after the formation of the trench.

Subsequently, a p-electrode 15 is formed by vapor deposition on the transparent electrode 14, an n-electrode 16 is formed by vapor deposition on the n-type contact layer of the n-type layer 11 exposed in the bottom surface of the trench. Either of the p-electrode 15 or the n-electrode 16 may be formed first. When they are formed of the same material, they may be formed at the same time. Thus, the Group III nitride semiconductor light-emitting device according to Embodiment 1 as shown in FIG. 1 was produced.

In the method for producing the Group III nitride semiconductor light-emitting device according to Embodiment 1, the thickness of the protective layer 12b is 5 Å to 8 Å, and the growth rate of the protective layer 12b is larger than 0.5 times and not larger than 1.1 times the growth rate of the well layer 12a, thereby improving emission performance.

Figure 3:
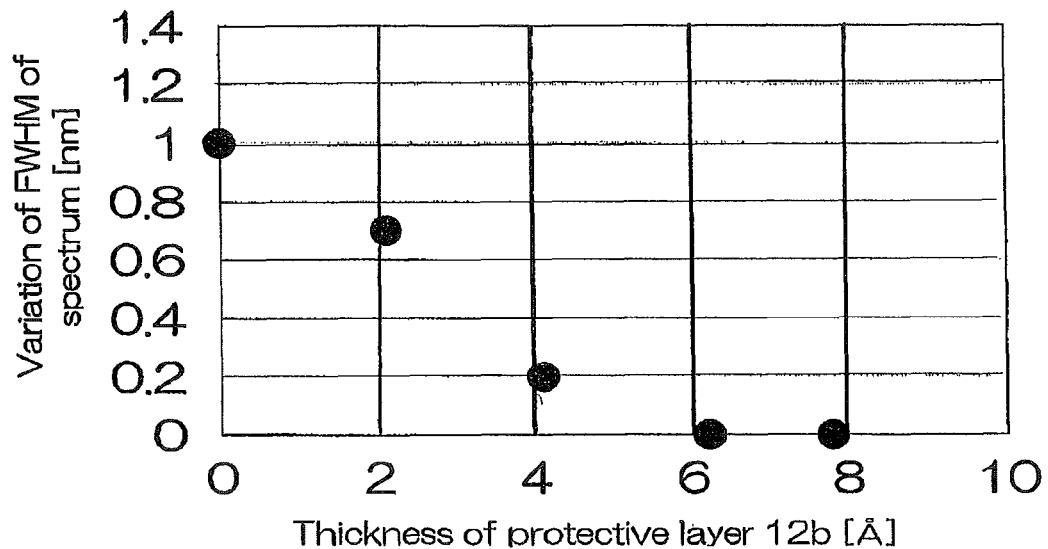
FIG. 3 is a graph showing the relationship between the thickness of protective layer 12b and the variation of FWHM of spectrum.

FIG. 3 is a graph showing the relationship between the thickness of the protective layer 12b and the variation of a full width at half maximum (FWMH) of a spectrum. The variation of the FWHM is defined as a difference to the FWHM as a reference at the thickness of 8 Å.

As is clear from FIG. 3, when the thickness of the protective layer 12b is 5 Å to 8 Å, the variation of the FWHM of spectrum is constant as 0, and the FWHM of spectrum does not change. When the thickness of the protective layer 12b is less than 5 Å, the variation of the FWHM of spectrum is increased as the thickness of the protective layer 12b is decreased. This is because the protective layer 12b becomes too thin, causing damage to the well layer 12a. Therefore, when the thickness of the protective layer 12b is less than 5 Å, the protective layer 12b does not fulfill its function. The protective layer 12b must have a thickness of 5 Å or more.

Figure 4:
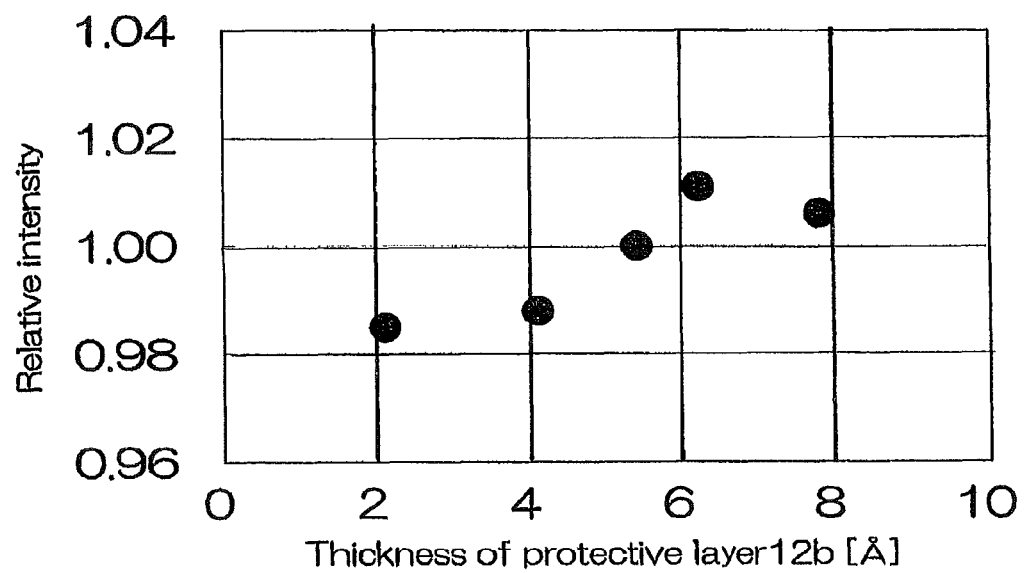
FIG. 4 is a graph showing the relationship between the thickness of protective layer 12b and the relative intensity of an emitted light.

FIG. 4 is a graph showing the relationship between the thickness of the protective layer 12b and the relative intensity of a light emitted from the light-emitting device. The relative intensity is defined as a ratio of the intensity at any thickness to the intensity at the thickness of 5.4 Å.

As shown in FIG. 4, when the thickness of the protective layer 12b is less than 4 Å, the relative intensity is slightly increased as the thickness of the protective layer 12b is increased, and when the thickness of the protective layer 12b is 4 Å or more, the relative intensity is remarkably increased. Moreover, when the thickness of the protective layer 12b is around 6 Å, the relative intensity shows a peak value. When the thickness of the protective layer 12b exceeds 6 Å, the relative intensity is gradually decreased. As is clear from FIG. 4, when the thickness of the protective layer 12b is 5 Å to 8 Å, the relative intensity equivalent or more compared to when the thickness of the protective layer 12b is two monolayers (=5.185 Å) can be obtained.

Figure 5:
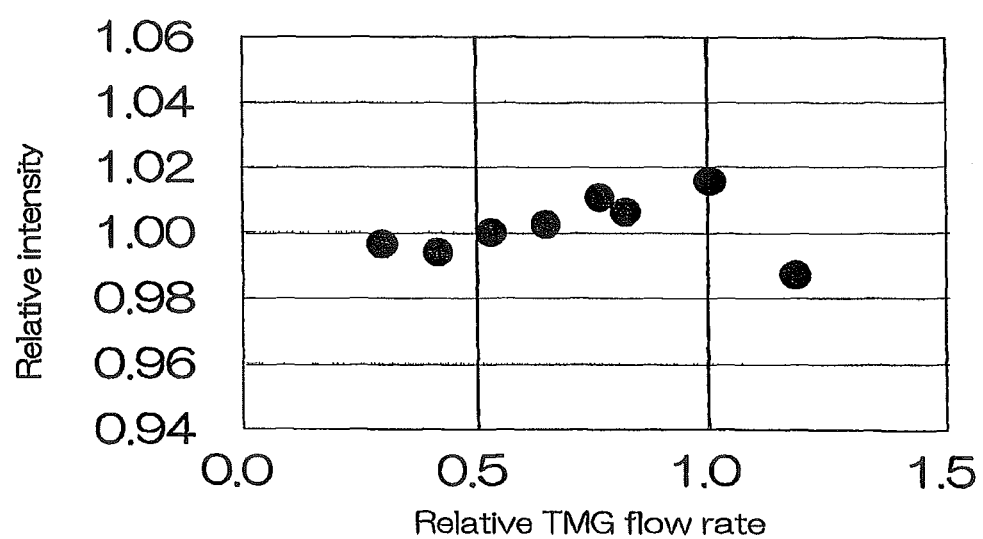
FIG. 5 is a graph showing the relationship between the relative TMG flow rate and the relative intensity of an emitted light.

FIG. 5 is a graph showing the relationship between the relative flow rate of TMG (hereinafter referred to as relative TMG flow rate) when forming the protective layer 12b and the relative intensity. The relative TMG flow rate is defined as a ratio of the TMG flow rate at forming the protective layer 12b to the TMG flow rate at forming the well layer 12a. The relative intensity is defined as a ratio of the intensity at any relative TMG flow rate to the intensity at the relative TMG flow rate of 0.5. The relative TMG flow rate of 0.5 corresponds to the TMG flow rate conventionally supplied when the protective layer 12b is formed. The TMG flow rate almost corresponds to the growth rates of the well layer 12a and the protective layer 12b.

As shown in FIG. 5, the relative intensity is monotonously and gradually increased as the relative TMG flow rate is increased. However, when the relative TMG flow rate exceeds 1, it is sharply decreased. When the relative TMG flow rate is within a range of larger than 0.5 and not larger than 1.1, the relative intensity is larger than 1.00, and the intensity is more improved than the conventional case when the relative TMG flow rate is 0.5. That is, when the growth rate of the protective layer 12b is larger than 0.5 times and not larger than 1.1 times the growth rate of the well layer 12a growth rate, emission performance can be more improved than the conventional case.

When the relative TMG flow rate is 0.7 to 1.0, the relative intensity is 1.01 or more, the intensity can be more improved. Particularly, when the relative TMG flow rate is 1.0, that is, when the protective layer 12b is formed at the TMG flow rate when the well layer 12a was formed, the intensity can be improved most.

The reason why the peak value of the relative intensity exists around the relative TMG flow rate of 1.0 is considered as follows. The fluctuation of raw material gases is suppressed when switching from the formation of the well layer 12a to the formation of the protective layer 12b by making the TMG flow rate when the protective layer 12b is formed closer to the TMG flow rate when the well layer 12a was formed. As a result, the deterioration of crystal quality at the interface between the well layer 12a and the protective layer 12b is suppressed.

Thus, as is clear form FIGS. 3 to 5, when the thickness of the protective layer 12b is 5 Å to 8 Å, and the growth rate of the protective layer 12b is larger than 0.5 times and not larger than 1.1 times the growth rate of the well layer 12a, emission performance can be improved.

The present invention is not limited to the Group III nitride semiconductor light-emitting device having the structure according to Embodiment 1, and can be applied to a Group III nitride semiconductor light-emitting device having any structure, so long as it has a MQW structure-light-emitting layer. For example, the present invention can be applied to a flip-chip type light-emitting device or a light-emitting device having a vertical conductive structure obtained by using a conductive substrate or removing a substrate by a laser lift-off technique.

In Embodiment 1, the well layer 12a is formed of InGaN. However, the present invention is not limited to this, so long as the well layer 12a is formed of Group III nitride semiconductor containing In. The well layer 12a may be doped with n-type impurity such as Si. For example, the well layer 12a may be formed of AlGaInN. In Embodiment 1, the barrier layer 12c is formed of AlGaN. However, the present invention is not limited to this, so long as the barrier layer 12c is formed of Group III nitride semiconductor containing Al and having a bandgap larger than that of the well layer 12a. For example, the barrier layer 12c may be formed of AlGaInN.

The Group III nitride semiconductor light-emitting device produced by the method of the present invention can be employed as a light source of an illumination apparatus or a display apparatus.

What is claimed is:

1. A method for producing a Group III nitride semiconductor light-emitting device including a light-emitting layer having a MQW structure in which a plurality of layers units are repeatedly deposited, each layer unit comprising a well layer formed of Group III nitride semiconductor containing In, a GaN protective layer, and a barrier layer formed of Group III nitride semiconductor containing Al sequentially deposited,
   wherein the protective layer is grown at the same temperature as employed for the well layer, at a growth rate of larger than 0.5 times and not larger than 1.1 times the growth rate of the well layer through MOCVD on the well layer, so as to have a thickness of not less than 5 Å and not larger than 8 Å at the start of growth of the barrier layer being formed after the formation of the protective layer.

2. The method for producing the Group III nitride semiconductor light-emitting device according to claim 1, wherein the protective layer is formed so as to have a thickness of two or three monolayers at the start of growth of the barrier layer being formed thereafter.

3. The method for producing the Group III nitride semiconductor light-emitting device according to claim 1, wherein the protective layer is grown at a growth rate of not less than 0.7 times and not larger than 1.0 times the growth rate of the well layer.

4. The method for producing the Group III nitride semiconductor light-emitting device according to claim 2, wherein the protective layer is grown at a growth rate of not less than 0.7 times and not larger than 1.0 times the growth rate of the well layer.

5. The method for producing the Group III nitride semiconductor light-emitting device according to claim 3, wherein the protective layer is grown at the same growth rate as that of the well layer by maintaining the flow rate of Ga raw material gas to be the same as when the well layer is formed.

6. The method for producing the Group III nitride semiconductor light-emitting device according to claim 4, wherein the protective layer is grown at the same growth rate as that of the well layer by maintaining the flow rate of Ga raw material gas to be the same as when the well layer is formed.

7. A method for producing a Group III nitride semiconductor light-emitting device according to claim 1, wherein the barrier layer is grown at a higher temperature than the growth temperature of the well layer and the protective layer.

8. A method for producing a Group III nitride semiconductor light-emitting device according to claim 2, wherein the barrier layer is grown at a higher temperature than the growth temperature of the well layer and the protective layer.

9. A method for producing a Group III nitride semiconductor light-emitting device according to claim 3, wherein the barrier layer is grown at a higher temperature than the growth temperature of the well layer and the protective layer.

10. A method for producing a Group III nitride semiconductor light-emitting device according to claim 4, wherein the barrier layer is grown at a higher temperature than the growth temperature of the well layer and the protective layer.

* * * * *